(12) United States Patent
Baier

(10) Patent No.: US 7,642,673 B2
(45) Date of Patent: Jan. 5, 2010

(54) OPERATING DEVICE FOR AN ELECTRICAL APPLIANCE AND METHOD FOR OPERATING AN ELECTRICAL APPLIANCE

(75) Inventor: Martin Baier, Ettllingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 256 days.

(21) Appl. No.: 11/548,036

(22) Filed: Oct. 10, 2006

(65) Prior Publication Data
US 2007/0181410 A1  Aug. 9, 2007

(30) Foreign Application Priority Data
Oct. 12, 2005  (DE) .................. 10 2005 049 995
Dec. 14, 2005  (DE) .................. 20 2005 019 978 U

(51) Int. Cl.
*H01F 37/00* (2006.01)
(52) U.S. Cl. ...................................... 307/104
(58) Field of Classification Search ............. 307/104; 200/179, 293, 296, 336, 338, 520, 564, 565, 200/567, 600
See application file for complete search history.

(56) References Cited
U.S. PATENT DOCUMENTS

| 4,379,287 A | * | 4/1983 | Tyler et al. ................ 341/33 |
| 5,128,661 A | * | 7/1992 | Fowler ...................... 345/184 |
| 5,920,131 A | | 7/1999 | Platt et al. |
| 6,838,785 B2 | * | 1/2005 | Schilling .................... 307/104 |
| 6,867,379 B2 | * | 3/2005 | Hayashi ....................... 200/4 |
| 2005/0078027 A1 | * | 4/2005 | Philipp ....................... 341/173 |

FOREIGN PATENT DOCUMENTS

| DE | 44 32 399 A1 | 3/1996 |
| DE | 199 22 638 A1 | 11/2000 |
| DE | 102 29 629 A1 | 1/2004 |
| DE | 20 2004 017 133 U1 | 3/2005 |

OTHER PUBLICATIONS

German Search Report for German Application No. 10 2005049 995.3, dated Aug. 3, 2006.

* cited by examiner

*Primary Examiner*—Jared J Fureman
*Assistant Examiner*—Hal I Kaplan
(74) *Attorney, Agent, or Firm*—Alston & Bird LLP

(57) ABSTRACT

An operating device for an electric cook-top is disclosed having a rotary control operating unit, which is retained in position in a magnetic rotary manner on an outer surface of the cook-top. In one embodiment, the rotary control is provided with a contact switch for signal transmission of a switching process to a control unit mounted below the outer surface. In one embodiment, the contact switch is a contact switch with a capacitive coupling through the outer surface.

33 Claims, 4 Drawing Sheets

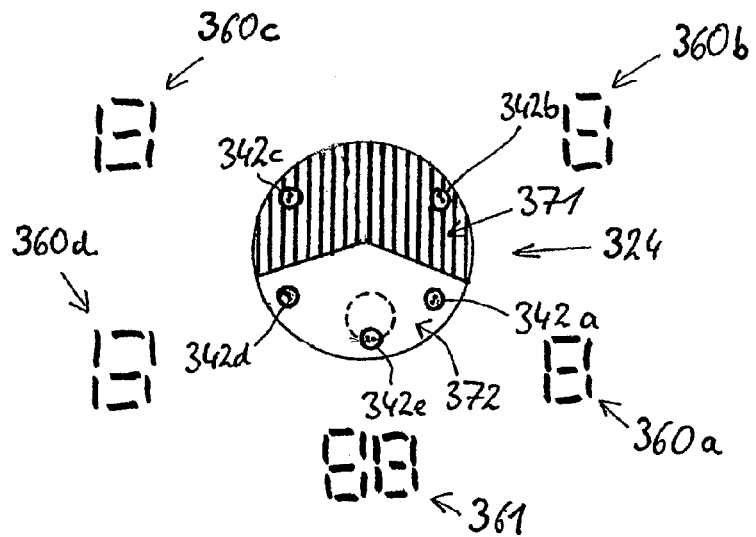
Fig. 5
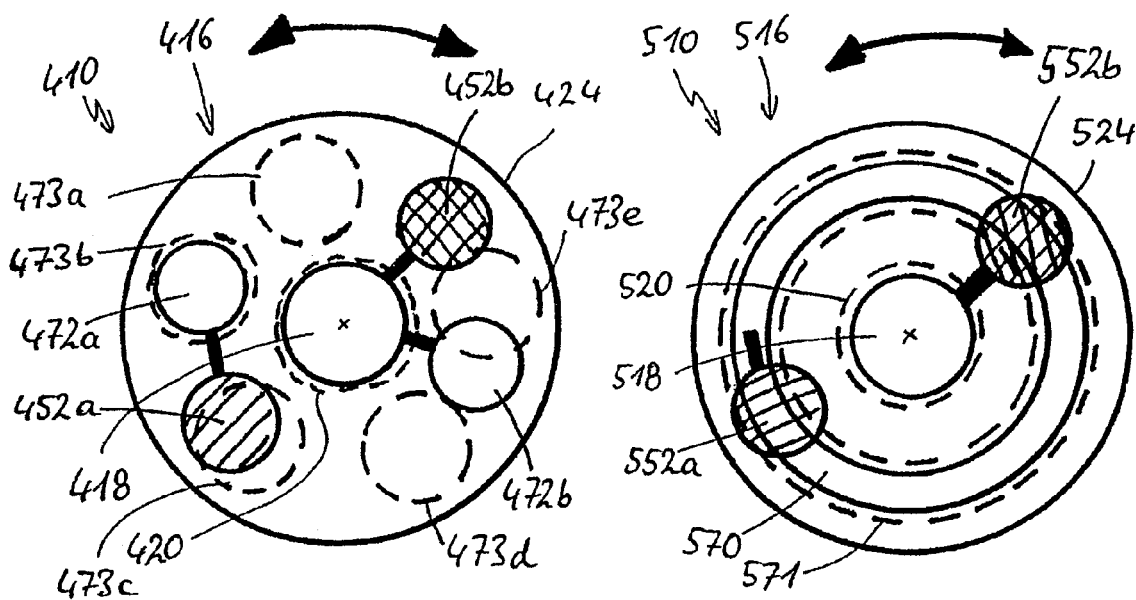
Fig. 6
Fig. 7

OPERATING DEVICE FOR AN ELECTRICAL APPLIANCE AND METHOD FOR OPERATING AN ELECTRICAL APPLIANCE

CROSS REFERENCE TO RELATED APPLICATIONS

This application claims priority from German Application No. 102005049995.3, which was filed Oct. 12, 2005 and German Application No. 202005019978.8, which was filed Dec. 14, 2005, of which the contents of both are hereby incorporated by reference.

FIELD OF APPLICATION

The invention relates to an operating device for an electrical appliance, for example an electrical heating appliance, with an operating unit comprising a rotary or sliding control. The operating unit is mounted on a panel or outer surface of the electrical appliance and operation of the unit occurs by movement in a rotary or sliding manner. Furthermore, the invention relates to a method for operating such an electrical device.

BACKGROUND

DE 19833983 A1 generally discloses a rotary control as a power control or operating device for an electrical appliance, for example for a hob or cook-top.

DE 29605163 U1, discloses a rotary control having an optical waveguide that is used for indicating the transfer of the rotary position of an operating unit. The optical waveguide channels light in the vicinity of the rotational axis of the rotary control. The light is fed from below into the optical waveguide in the downwards direction as a function of the rotary position. Beneath an outer surface in the vicinity of the rotation axis of the rotary control, a light source is provided along with photosensitive sensors for detecting position of the rotary control. The sensors record the light passing through the optical waveguide and emitted at the underside of the operating unit as a function of the rotary position of the rotary control at different locations. DE 10212954 A1 describes the use of an operating unit with microprocessor, which detects the rotary position of a rotary toggle of the operating unit relative to an angle-stable bearing device or outer surface on which the rotary toggle is mounted, and relays it to a receiver located below the outer surface. These operating devices are particularly suitable for use with electrical heating appliances with an outer surface (such as a cook-top), because these devices make it possible to for a user to operate the electrical heating appliances by means of operating units located on the glass ceramic plate and without it being necessary to provide openings in the glass plate.

Known operating devices are considered disadvantageous in that they only permit the recording or detecting of one angular position or one position change. Thus, it is difficult to implement more complex functions than the power control of, for example, a hob or cook-top.

The problem of the invention is to provide an aforementioned operating device and a method able to avoid the prior art problems and, in particular, an operating device for an electrical appliance, which is superior to the prior art with respect to operability or operating method.

BRIEF DESCRIPTION OF THE DRAWINGS

Embodiments of the invention are described in greater detail hereinafter relative to the drawings, wherein show:

FIG. 5 A variant of the embodiment according to FIG. 2 with optical rotation position detection.

FIG. 6 A fourth embodiment as a variant of that of FIG. 2 in plan view with a different transmission of a switching signal from a rotary toggle to the underside of the glass ceramic plate, together with the detection of the rotary position above the same.

FIG. 7 A fifth embodiment as a variant of that of FIG. 6 with the transmission of two rotation position-independent switching signals.

DETAILED DESCRIPTION

Figure 1:
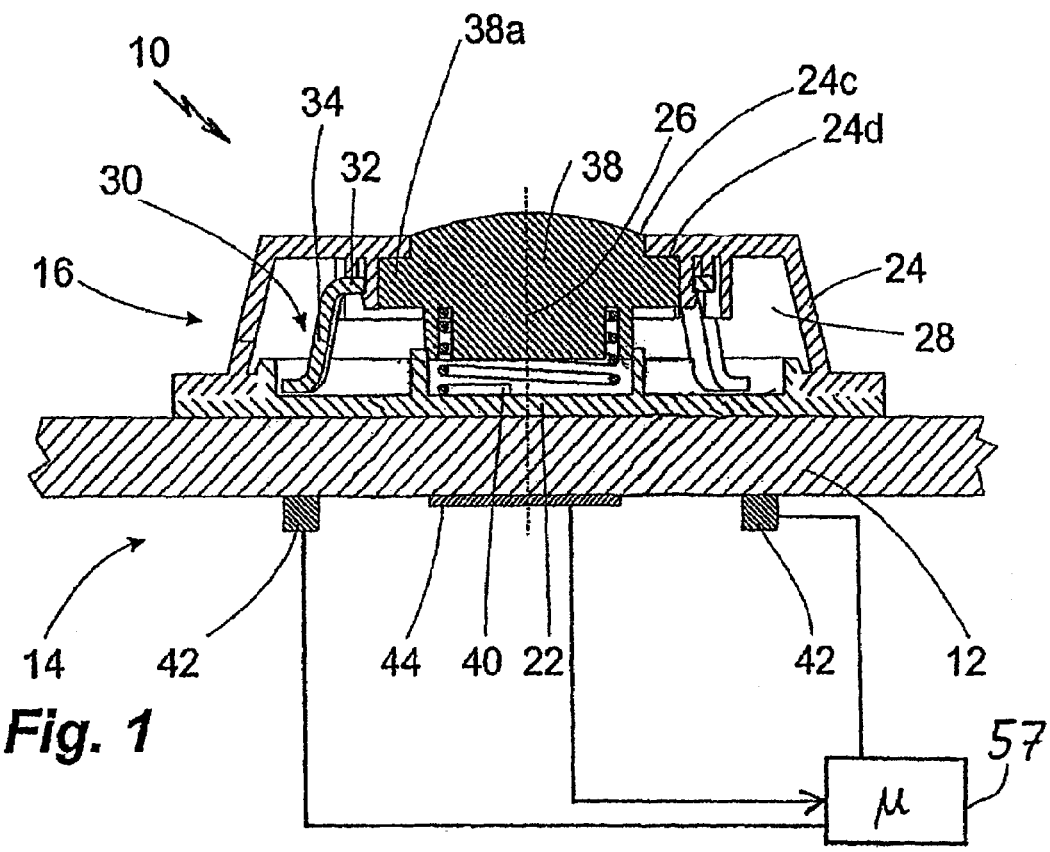
FIG. 1 A first embodiment of an inventive operating device in a sectional representation with the switching means in the un-operated state.

This problem of the prior art is solved by an operating device having the features as disclosed herein. Advantages and preferred developments of the invention form the subject matter of further claims and are discussed in greater detail hereinafter. By express reference, the wording of the claims is made into part of the content of the description. Some of the features described hereinafter are only referred to once. However, independently thereof, they apply both to the operating device and also to the corresponding operating method.

According to one aspect of the invention, on the rotary or sliding control (generally referred to hereinafter as "rotary control") is provided at least one further switching means constructed for the signal transmission of a switching process to a control unit located beneath the outer surface. The operating unit can be constructed in one piece, so that the entire operating unit forms the rotary control and is rotated in its entirety during a rotary process of the rotary control. It is alternatively possible to construct the operating unit in two parts and, during operation, a bearing device resting on the outer surface of the electrical appliance is preferably located in a position-stable and angle-stable manner. In such an embodiment, rotation of the rotary control leads to the latter rotating about a main rotation axis relative to the bearing device. The switching means are advantageously located in the vicinity of the top of the rotary control or on the same, where they are very readily accessible. Generally, operation of the rotary control takes place through the shaft of its side wall and there is no need to fear an accidental release of specific switching means. However, it is possible to locate switching means there. In the embodiment of the operating unit with a bearing device, the rotary control can be rotated relative to the bearing device. It is considered particularly advantageous if the switching means are constructed in an angle-stable manner relative to the bearing device. This is particularly the case with complex switching means, for example, comprising several pushbuttons or knobs, each of which is allocated a different function. In another embodiment a rotary control can be placed on a pivot shaft of a controller such as a power controller.

The use of the operating device with switching means on the rotary control permits a reliable, easy operation of the electrical appliance. Thus, it is possible to control the operation of a cooking appliance not solely via the angular position or operating unit position, but instead the inventively provided switching means can be constructed as on-off switches for a hotplate. It is thus possible to enter a different operating mode or to trigger special functions. This, for example, prevents accidental operation of a heating element that is the result of accidental rotation of the rotary control. A further function of the switching means according to the invention can be the initiation of a parboiling surge or the confirmation of an option determined by the control and displayed on a display, for example, the start of operation of a selected hotplate. It is possible to use the rotary control to provide further functionality through the further switching means or correspondingly implemented operating method.

According to another embodiment of the invention, the switching means are constructed as a pushbutton. Such a pushbutton constitutes a simple embodiment of the switching means. Combined with a rotary control, the operating possibilities compared with an operating unit with a pushbutton-free rotary control are significantly increased. In particular, an electrical appliance having a larger output means can be completely operated with such a pushbutton-equipped rotary control. The rotary control can serve to bring about an alternation or change between options and the pushbutton for confirming individual options.

The pushbutton as switching means is particularly advantageous in those operating units having no angle-stable bearing device. Since, in such operating units, due to the lack of a bearing device, the rotation of the rotary control necessarily leads to the rotation of the switching means relative to the outer surface. In such operating units, the switching means are less suitable for modifying the relative position thereof, so that an operator does not always find the same functions at the same location. It is possible for the rotary control to form the complete pushbutton or pressure switch, which can be rotated relative to an outer surface and can be pressed in perpendicular thereto. This prevents contamination entering gaps between the rotary device and pushbutton.

In another embodiment of the invention, a pushbutton, when operated, closes an electric contact. This pushbutton can be a conventional micro-switch linking two contacts for a signal transmission to the control unit. Appropriately, there can also be an electrically conductive and preferably metallic pushbutton, which is depressed by mechanical actuation on an operator-side capacitor plate and bringing about capacitive coupling. The latter is positioned with a fixed spacing from a bearing-side capacitor plate. It transmits a signal or contact beneath the plate to a receiver, such as is known from EP 859467 A1, for example, for capacitive contact detection. The receivers or capacitive sensor elements beneath the outer surface can also be constructed as therein, i.e., as flexible, electrically conductive bodies.

According to another embodiment of the invention the switching means constitute a contact switch. Contact switches are particularly economically advantageous and require no supports, as in, for example, a pushbutton in the operating unit. The contact switch can be constructed as a metal core or metal part firmly integrated into the operating unit whose influence on a capacitor plate, as the sensor, located beneath the outer surface, is influenced by contact by the operator. A corresponding operating unit is virtually completely free from wear, because no electrical or movable components are needed. Particularly with regards to the contamination of such bearings and supports, this is a considerable advantage. In another embodiment of the invention the additional switching means require no further moving parts, which reduces costs and increases operating reliability.

According to another embodiment of the invention, the operating device is constructed for recording the rotary position of the rotary control on the side of the operating unit with a magnetic armature, which is preferably connected to rotate with the rotary control. On the side of the outer surface, there are magnetic sensors for recording the movement of the magnetic armature. As a result of an operation of the switching means, the distance between the armature and the outer surface for bearing is modified. This can alternatively take place optically by differently designed undersides of the rotary toggle and optical sensors, such as reflected light barriers. A further alternative is by using capacitively corresponding surfaces in the rotary toggle above and below the outer surface, which have different coverage as a function of the rotary position.

The principle of using a magnetic armature and Hall sensors for recording a rotation of the rotary control is known from DE 10212953 A1, which disclose a magnetized metal spider as the armature. Through the displacement of the magnetic armature towards the outer surface, or away from the latter during an operation of the switching means, it is ensured that there is no need to modify the bottom parts of the operating device compared with the prior art. The Hall sensors, in conjunction with a control processor, can detect rotary movement of the rotary control by means of the Hall voltage, in which the switching state of the switching means takes place during said rotary movement. Thus, for example, by means of such an operating device, it is possible to rapidly set a temperature and a cooking finishing time, in that both values are set via the rotary control and the control can be pressed downwards for setting said finishing time. Instead of pressing down, it is also possible to operate the further switching means.

According to another embodiment of the invention, the operating unit is constructed for transmission of the signal from a switching process of the switching means by means of a change to a magnetic and/or electrical field strength below the outer surface. This change can be brought about by a position modification such as tilting part of the operating unit, which permits simple construction of the latter. A switching or adjustment process of the switching means leads to a displacement, a tilting about a horizontal or vertical axis or a horizontal displacement or rotation, which can be determined by corresponding sensors below the outer surface. In another embodiment, a metal element coupled to a pushbutton is moved in the direction of the outer surface and both the pushbutton and the connection of the pushbutton to the metal element are constructed for conductive action.

This above embodiment creates a direct, conductive connection between the operator and the metal element at the time of operation. The displacement of the metal element can be determined by a capacitor plate positioned below the outer surface by means of the resulting changing capacitance of the capacitor plate. A similar arrangement is possible for a switch with more than two switching positions, in that the spacing of the metal element from the outer surface is dependent on the selected switch position. In this case, determination of the switching position can be obtained from the capacitance of the capacitor plate. This operating unit-side, purely mechanical implementation of the switching means is desirable due to low costs and high reliability.

According to another embodiment of the invention, the operating unit comprises a microprocessor which detects a switching process of the switching means and transmits a signal in wireless manner to the electrical appliance. Such a construction also permits the use of more complex, additional switching means on the controller. Using a microprocessor, it is possible to interrogate several switching means and record the various positions of each switching means. The power supply for the microprocessor is preferably implemented by an inductive infeed of electric power by induction coils within the operating element and below the outer surface. The switching state can be transmitted to the electrical appliance in various ways, including, for example, radio transmissions. However, it is preferable to use a pair of induction coils which, as described in DE 10212954 A1 are used both for feeding power into the operating unit and communicating data from it.

The rotary control can be illuminated or have lighting means, placed in the vicinity of the switching means for the marking thereof. The lighting means can be an LED. A power supply preferably takes place by contactless power transmission, preferably inductively or with induction coils in the manner described hereinbefore.

As an alternative to a removable rotary control, the operating device or rotary control can be held by a fixed pivot shaft. The shaft passes through a corresponding hole in the panel or outer surface of the electrical appliance. The shaft can be located on a unit such as a potentiometer, grey code switch or power controller. Power transmission can take place by means of, or through, said shaft. For this purpose, an electric conductor can be provided, using a wire or conductor running along the shaft, which can be moulded into the shaft.

Preferably, the pivot shaft at the rotary control is connected to a switching means in the latter, preferably by means of a direct electrical connection. Such a switching means can be constructed in the manner described hereinbefore.

An electrical conductor on the shaft can be connected at the lower end to a capacitor plate, together with a counter-capacitor plate. An electrical conductor on the shaft can be connected in a central area with a first capacitor surface along the axial circumference. The first capacitor surface is surrounded at a limited distance by a further, second capacitor surface, so that in this way a capacitive signal transmission can take place.

According to another embodiment, the rotary control can be constructed in multistage manner with different or decreasing diameters. In one embodiment, the control has a large diameter, first toggle portion as the lower part and a second, smaller diameter toggle portion as the upper part. Thus, a fine setting can be carried out on the large, first toggle portion. A rapid, coarse setting can be implemented on the smaller, second toggle portion. If each toggle portion is connected to, or has different switching means, it is possible in this way to in each case implement a differentiatable operation.

In another embodiment, the rotary control can be flush-mounted in the panel or outer surface of the electrical appliance, preferably by means of a two-part pivot shaft, which can be engaged in one another in the manner of a telescope. In the inserted state the rotary control advantageously does not project over the panel or outer surface. It can maintain the remaining functionality by means of the pivot shaft.

These and further features can be gathered from the claims, description and drawings and individual features can in each case be implemented singly or in the form of sub-combinations in an embodiment of the invention and in other fields and can represent advantageous, independently protected constructions for which protection is claimed here. The subdivision of the application into individual sections and the sub-headings in no way restrict the general validity of the statements made there under.

FIG. 1 shows a first embodiment of an operating device according to the invention. This operating device 10 is provided on a glass ceramic plate 12, particularly as an operating device for a cook-top. The operative device comprises stationary device elements 14 fixed to the underside of glass ceramic plate 12, as well as an operating unit 16 mounted from above. The operating unit 16 is held in a clearly defined position on glass ceramic plate 12 by magnetic force action, which can be produced by magnets (not shown in the figure). The operating unit can be rotated about a rotation axis 26. It is possible to provide a central magnet. Alternatively the operating unit can have a bearing device, as will be explained hereinafter.

A magnetized metal spider 30 is placed in fixed manner in a casing interior 28 formed by rotary control 24. The metal spider 30 comprises an inner ring 32 and typically five extensions 34 extending outwards and downwards from inner ring 32. The extensions 34 are magnetically active or equipped with small magnets, so that the metal spider movement can be recorded by Hall sensors. A latch connection is provided for fixing the metal spider 30 to rotary control 24, alternatively a bonding or moulding of the entire rotary control is possible.

In the centre of rotary control 24 a recess 24c is provided and into it is inserted from below a metallic pushbutton 38. Pushbutton 38 has a radial widening 38a, which cooperates with stop faces 24d of rotary control 24 in such a way that pushbutton 38 is held in casing interior 28. On the underside 22 is provided a helical spring 40 for pressing pushbutton 38 from below against the top of rotary control 24.

Thus, the operating unit 16 of FIG. 1 has two modes of operation. According to the first mode, the rotary control 24 can be rotated along with the metal spider 30 around a central axis 26. The movement of the magnetized extensions 34 is recorded by Hall sensors 42 located beneath the glass ceramic plate 12. The Hall sensors 42 are connected to a diagrammatically represented control unit ("controller") 57, which evaluates and detects the signals. The control unit, incorporating a processor, transforms the actuation of the rotary control to change the operation of the cook-top or hob.

The second actuation mode involves activating the pushbutton 38 by pressing it downwards against spring 40, so that it virtually engages on the bearing device 22. This changes the capacitance of a capacitor plate 44 below the glass ceramic plate, specifically, the metallic pushbutton 38 couples the finger of an operator electrically to the capacitor plate. The change is recorded by the controller 57 connected thereto and which is connected to capacitor plate 44. The evaluating method disclosed in EP 859467 A1 can be adapted for this purpose. In place of the separate, radially inner pushbutton, the entire upper part of the rotary control 24 can be pressed downwards against a spring tension or the like in order to bring about an approach to the capacitor plate 44.

In another embodiment, the pushbutton can be in two or more parts. Such a bipartite subdivision can be radial or concentric in two or more parts, for example two halves. By means of varying the large, pressed surface above the capacitor plate, the controller is able to detect which part or how many parts have been pressed down.

The operating device 10 shown comprises operating unit 24 and the operating device elements 14 firmly provided on glass ceramic plate 12, which has a favourable structure and reliable operation. Through the switching function of pushbutton 38 being implemented by aforementioned operating switching means, the switching on and off of a hotplate, or the triggering of a parboiling surge, can be readily implemented, as can other inputs.

In another embodiment, the signal transmission of the control unit of the further switching means is accomplished using an optical reflected light barrier that is positioned below glass ceramic plate 12 that can detect the distance from the underside of knob 38. If it is at the top, it is detected a first operating mode. If it is pressed down, it is detected as a second operating mode. Thus, further switching can take place in this way. A proximity sensor can be used as an alternative to an optical reflected light barrier.

Figure 2:
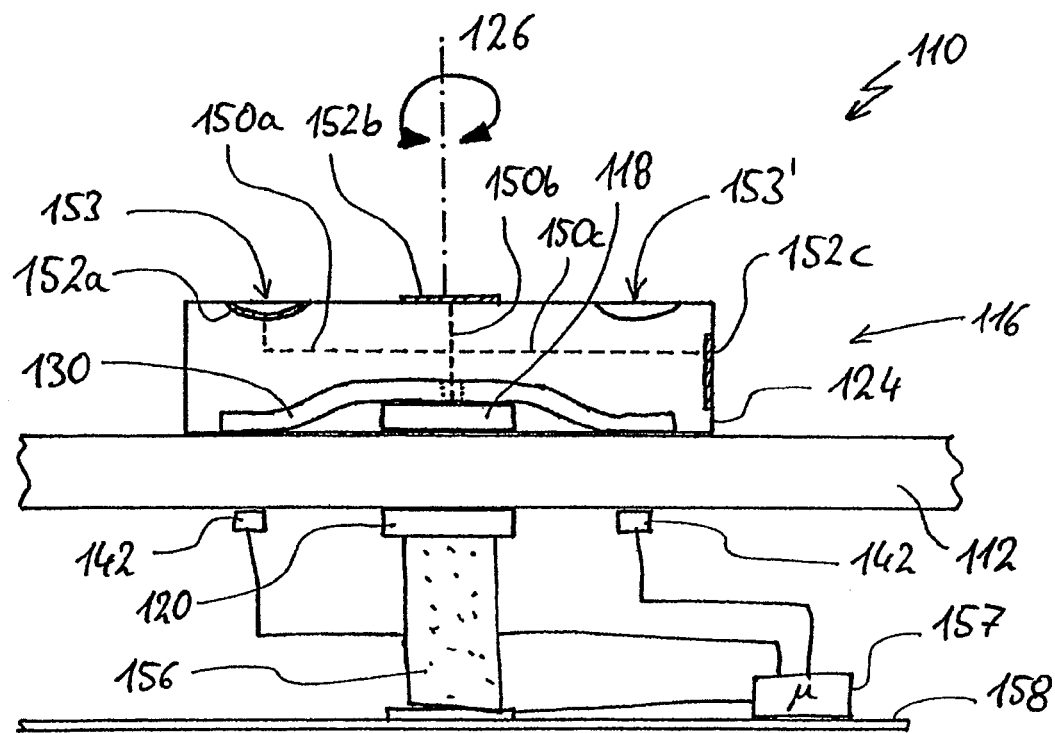
FIG. 2 A second embodiment of an inventive operating device in a sectional representation view.

FIG. 2 shows a variant of an arrangement similar to FIG. 1. An operating device 110 is provided on a glass ceramic plate 112. Once again operating unit 116 is constructed as a type of rotary toggle 124 and can be rotated about rotational axis 126. The unit is positioned over the rotational axis by a central magnet 118 in the rotary toggle and a facing magnet 120 beneath glass ceramic plate 112. A metal spider 130 is provided in rotary toggle 124 above magnet 118 and can be constructed as having a five-armed form and is connected to magnet 118 so that the individual arms of metal spider 130 are also magnetic. The rotary position can be determined by the Hall sensors 142 beneath the glass ceramic plate.

Magnet 118 is connected to three electrically conductive connections 150a-c, shown in broken line form, with various electrically conductive or metallic, flat contact sensors 152a-c. This arrangement is only illustrative and is intended to illustrate different arrangements of contact sensors 152. In practice, typically only one of the several arrangements of the contact sensors 152 is utilized with the corresponding connection 150.

The lower magnet 120 is electrically connected by means of an elastic, electrically conductive body 156 to a microprocessor based controller 157 on a printed circuit board 158. The Hall sensors 142 are also connected to said controller 157.

If a user contacts one of the contact sensors 152, an electrical connection is formed between the contact sensor and central magnet 118. This can be brought about by capacitive coupling between magnets 118 and 120 acting as electrically conductive surfaces and the connection of electrically conductive body 156 to controller 157. Consequently, the controller is able to detect the user's contact of one of the contact sensors through the glass ceramic plate 112 in accordance with the operating principle of a capacitive contact sensor, as is described in EP 859467 A1, for example. As the rotary toggle 124 always rotates about its central axis 126, the two magnets 118, 120 consequently do not move towards or away from one another. The positional association is always identical and contact detection always functions. Thus, the contact sensor 152 cooperating with magnet 118 constitutes the switching means, namely a so-called contact switch.

The intended use can influence at which of the shown locations on rotary toggle 124 the contact sensor 152 is fitted. The advantage of contact sensor 152a position in a radially outer and top depression 153 is that engagement with a finger can take place in said depression 153 and then the rotary toggle 124 can be rotated at a small angle, as well as a random large angle, and in certain circumstances even several revolutions. When a depression is located with the same radial spacing from a further depression 153', but without having a contact sensor, then either one of the two depressions can be used to accomplish rotation. However, one depression can be used rotate and initiate a switching function, whereas the other depression can be used to rotate without initiating a switching function.

The provision of the contact sensor 152b in the centre has the advantage of allowing actuation similar to a normal contact switch without a rotary movement, but also allowing small angular rotation with simultaneous switch actuation. The same applies regarding the contact sensor 152c fitted to the outside. In another embodiment of the invention, it is also possible to have two contact sensors fitted at different points. Differentiation as to which of the contact sensors has been contacted, can take place by further wiring, as explained hereinbefore.

The advantage of such a construction of the rotary toggle 124 is that no moving parts have to be provided and the entire interior can be completely moulded for example with plastic, which gives a robust and cost-effective scheme for manufacturing a rotary toggle control.

Figure 3:
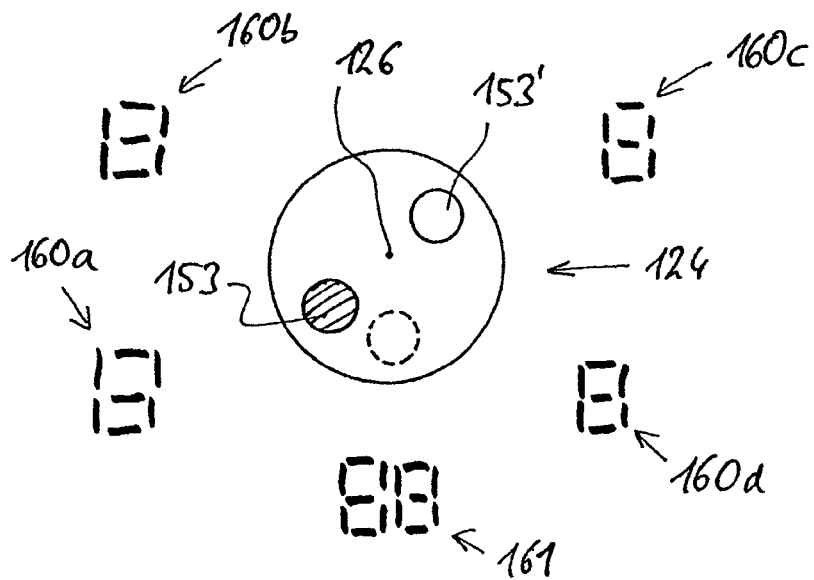
FIG. 3 A plan view of the second embodiment corresponding to FIG. 2.

In the plan view of FIG. 3 of an operating device 110 according to FIG. 2, it is possible to represent cooking stage displays for four hotplates on a corresponding cook-top position on glass ceramic plate 112 by using LED seven segment displays 160a-d. Below displays 160a and 160d are provided a two-position LED seven segment display 161 for a timer function. The hatched indicia on contact switch 152a in FIG. 2 on rotary toggle 124 can be used to detect not only a relative rotation, but also an absolute angular position. By implementing the contact sensor 152 as the switching means, it is either possible to switch on or off an individual function, or by rotating toggle 124 whilst simultaneously contacting sensor 152 one of the hotplates can be selected in a first mode of operation. Thus, in certain circumstances, during such a rotation (and corresponding to the rotation angle) the displays 160a-d can be successively switched into a selection mode and displayed by flashing. This continues until contact sensor 152a is contacted and this can be detected by means of the contact switch arrangement described regarding FIG. 2.

If contact switch 152a is no longer contacted, this is detected by controller 157 and can switch into a different mode of operation, particularly for the power setting of a selected hotplate. Thus, by rotating rotary toggle 124 and without contacting sensor face 152, the power at the selected hotplate can be increased or decreased and this is shown on the corresponding display 160. On setting the desired power, either automatically, or in the following manner, the operation of the hotplate can start with this power stage. Alternatively, it is possible that contact switch 152a is briefly contacted again without rotation so as to provide a clear signal to controller 157 to start operation with the set power stage.

To activate a timer function displayed by display 161, during the selection process by rotation, display 161 can be activated, for example, by flashing. After releasing the contact sensor 152a the level thereof can be adjusted. Alternatively, and as a variant of the previously described method, after setting the power level, by contacting contact sensor 152a again and rotating it, the timer function is automatically set for the hotplate just set with respect to its function.

In another embodiment, it is possible to detect the different actuation of different contact sensors. Then in the previously described, different mode of operation, it is possible to alternate a setting by rotating the rotary toggle 124 and by contacting the given contact sensor.

Figure 4:
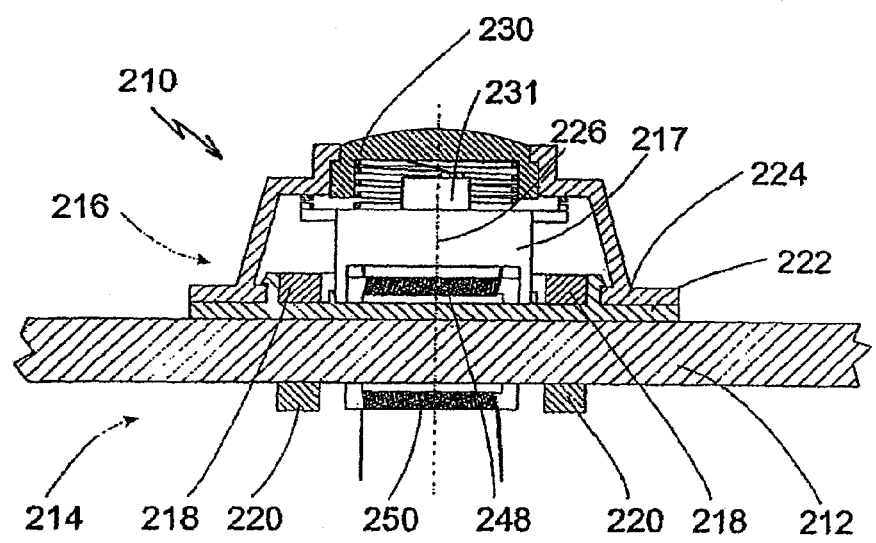
FIG. 4 A third embodiment of an inventive operating device in a part sectional representation with the switching means in the un-operated state.

FIG. 4 shows a third embodiment of an inventive operating device 210, where once again components 214 of said operating device are provided underneath a glass ceramic plate 212. As in the operating devices 10 and 110 of FIGS. 1 to 3, operating device 210 also has an operating unit 216, which is securely held on glass ceramic plate 212 by magnets 218 and 220. Unlike the embodiments of the operating device according to FIGS. 1 to 4, the operating unit shown in FIG. 4 has a microprocessor within the operating unit in a microprocessor casing 217, rather using plate-side signalling means for the direct detection of position changes of parts of the operating unit. This microprocessor firstly detects the rotary position of a rotary control 224 relative to a bearing device 222 to which the microprocessor casing 216 is firmly connected and secondly detects the switching state of pushbutton 230, which in the actuated state trips a micro-switch 231.

The microprocessor is supplied with power by means of two coils 248 and 250 in a "contactless" or "wireless" manner through which the microprocessor is inductively supplied from below with power. These coils also serve to transmit signals from the microprocessor to the electrical appliance controller (not shown). Such power and signal transmission is well known to those skilled in the art. In this embodiment, it is possible to alternately provide power to the microprocessor and transmit signals to/from the microprocessor. To supply the microprocessor with power during the transmission mode, the microprocessor casing 217 can contain a capacitor or another power storage device. Although the embodiment shown in FIG. 4 only has a single pushbutton as switching means, the embodiment with an operating unit-side microprocessor is particularly suitable for implementing, in the case of more complex switching means, signal transmission of the switching state to the electrical appliance controller. The power supply by means of coils can also be used for supplying power to lighting means in the rotary controller (not shown). The lighting means can be LEDs for different displays and can also be controlled by means of the microprocessor, for example, as a function of the actuating state of the pushbutton as switching means.

In some circumstances, it is desirable that in connection with the contact sensor 152a as shown according to FIG. 2 when used in accordance with the marking conventionally used with rotary toggle, that the display precisely indicates the hotplate which is selected. For this, it is necessary not only to be able to detect a relative rotation, but also the absolute rotation angle or position. This can be achieved by an arrangement as diagrammatically shown in FIG. 5. In place of the magnetic detection of the rotary position according to FIG. 2 around axis 226, here the underside of the rotary toggle 324 in an upper surface area 371 is coloured black or with a non-reflecting coating (this is illustrated in FIG. 5 by the corresponding hatching). In the lower surface area 372, which describes a much smaller angle of approximately 145 degrees, the underside of the rotary toggle 324 is coloured white or with a reflecting coating. Five optical sensors 342 are provided in the represented position below the glass ceramic plate in place of the Hall sensors and operate as reflected light barriers, for example. These optical sensors 342 can detect whether above them there is a dark area 371 or a light area 372. Through the provision of sensors 342 and the subdivision of surfaces 371, 372, although the angular position of rotary toggle 324 cannot be particularly accurately detected, it is still sufficiently precise. Through the arrangement of the contact sensor according to FIG. 4 on rotary toggle 324, it can be understood that the controller precisely knows the contact sensor or other marking indicating a particular point or display 160. Thus, even more rapidly and easily, it is possible to select a corresponding hotplate and set its power level.

In place of the division into two differently reflecting surfaces shown in FIG. 5, there can also be a finer or differently designed subdivision. This is based in certain cases on the number of differently detectable rotary positions and the intended use.

FIG. 6 shows diagrammatically a variant of the embodiment of FIG. 2. On a glass ceramic plate (not shown), operating device 410 has an operating unit 416 in the form of the rotary toggle 424. In continuous line form is shown the central magnet 418 located in rotary toggle 424 as well as two outer electrodes 472a, 472b forming an electrically conductive surface. As metallic surfaces, the outer electrodes 472 are advantageously provided as close as possible to the underside of rotary toggle 424, for example, as corresponding metal parts. Outer electrodes 472, like the central magnet 418, are connected in accordance with FIGS. 2 and 3 to the contact sensors on the top of rotary toggle 424. Thus, a contact surface 452a in the depression lower left is connected to outer electrode 472a and contact surface 452b in the depression upper right is connected to outer electrode 472b and central magnet 418. Magnet 418 and outer electrode 472b can be placed on the same metal part as the holder and electrical connection.

Parts of the operating device 410 beneath a glass ceramic plate are shown in broken line form. These are the other central magnet 420 and the lower outer electrodes 473a-e for cooperating with outer electrode 472b. Advantageously and in a corresponding number, they form a concentric, circumferential ring, so that on rotating rotary toggle 424 the upper electrodes 472a and b always circulate above the lower outer electrodes 473a-e.

The operation is as follows: as has already been described relative to FIG. 2, the user's contact with contact sensor 452b connected to central magnet 418 is always transmitted to lower magnet 420 and can be detected in this way.

During rotation, the upper outer electrode 472a is always above one of the lower outer electrodes 473a-e. Thus, it is possible to check by evaluation of all the lower segment electrodes 473 as to which one receives a corresponding signal from the upper outer electrode 472 located above the same. This permits a detection and determination of the rotary position, namely capacitively unlike in FIG. 5. If a person contacts contact sensor 452a connected to outer electrode 472a and rotates it in accordance with FIG. 5 to select one of the displays 360a-d or 361 for a hotplate, this is detected through the lower outer electrode 473 in this rotation position. Thus, for example, during operation, the desired hotplate can be selected through detection of the precise rotary position of rotary toggle 424. The advantage of such a selection mechanism is that the contact sensor not only indicates to the user the corresponding hotplate display selected, but at the same time the finger applied to this contact sensor is directed towards the same, which permits a particularly instinctive, correct operation.

It is subsequently possible with the finger to change to the other contact sensor 452b, which can be detected on one of the lower outer electrodes 473 and which also can be capacitively detected via the connection to the central magnet 418 on lower magnet 420. Once again it is possible to detect rotation, particularly as a power setting concerning the just selected hotplate, during which additionally the central contact sensor is contacted and actuated. Thus, two contact sensors are actuated and this can also be capacitively detected in this form.

Through the arrangement of the upper outer electrode 452a and 452b and the lower outer electrodes 473a-e, it is even possible to generally detect the rotary position for all settings of the rotary toggle 424, where the rotary position is decisive. Thus, in certain circumstances there is no need for the metal spider and the expensive, complicated Hall sensors according to FIG. 2.

If it is required to detect actuation of a switching means with a contact sensor, for example according to FIG. 2, as well as an evaluating circuit for a capacitive contact sensor, little effort and expenditure is involved in evaluating a plurality of similarly operating contact sensors and this can easily be brought about by a multiplexer. If a contact sensor 152 is present in a depression 153 corresponding to FIG. 2 and is connected to an upper outer electrode 452 according to FIG. 6 and the finger is placed in the depression for rotating rotary toggle 424, the rotary position and therefore a rotational movement or rotation angle can be detected. Further functions such as changing to another mode of operation or confirming a selected function can take place by means of the change between contact sensors 452a and b.

In another variant, it is possible to provide several contact sensors in the rotary toggle and to connect the same with further outer electrodes, similar to the outer electrodes 452 in FIG. 6. These further outer electrodes can then differ from those shown in that they have a double, triple or quadruple width, i.e., they are much larger. Thus, once again, by detecting the coverage or simultaneous actuation of the lower outer electrodes 473a-e, a differing signal is possible, so that once again a plurality of additional switching means in the form of additional contact sensors can be created. An evaluation is relatively reliably and simply possible.

FIG. 7 diagrammatically shows a variant of the embodiment according to FIG. 6. On a glass ceramic plate (not shown), operating device 510 has an operating unit 516 in the form of rotary toggle 524. In continuous line form are shown central magnet 518 in the rotary toggle 524 and a concentrically positioned, electrically conductive ring electrode 570. Ring electrode 570 is a metallic surface advantageously located as close as possible to the underside of rotary toggle 524, but is insulated downwards and against magnet 518, for example, as a corresponding metal part. Ring electrode 570 is connected to contact sensor 552a and central magnet 518 with contact sensor 552b. The contact sensors can be placed in depressions on the top of rotary toggle 524.

Parts of the operating device 510 placed beneath a glass ceramic plate are shown in broken line form. These are constituted by the other central magnet 520 and the second, lower ring electrode 571, which somewhat overlaps the first ring electrode 570 in the rotary toggle.

The operation is as follows: as has already been described, a contact of the contact sensor 552b connected to central magnet 518 is transmitted to the lower magnet 420 and can be detected. As the upper ring electrode 570 always coincides with the lower ring electrode 571, in much the same way as the two magnets, a contact of the contact sensor 552a connected to the upper ring electrode 570 can be also downwardly transmitted. The transmission via central magnet 518 and upper ring electrode 570 consequently always takes place independently of the rotary position of rotary toggle 524.

During operation, by rotation, "scrolling" takes place through various functions. Subsequently, by means of one of the contact sensors 552a or 552b, an input is made indicating a switching action. During rotation it is possible to maintain actuation of contact sensor 552a by contact. In alternation, confirmation can take place with contact sensor 552b.

According to FIG. 5, the detection of a rotary position can take place optically. Alternatively, detection can take place according to FIG. 2. In a particularly complicated construction, there can also be a combination with FIG. 6, it being possible to detect a rotary position with and without further switching function and by means of the ring electrode a position-independent, further switching function.

In another embodiment, it is also possible to have several contact sensors in the rotary toggle and to connect them to further ring electrodes. There can also be a plurality of additional switching means in the form of additional contact sensors. This permits a relatively reliable, simple evaluation.

Alternative possibilities exist for detecting a contact as a switching actuation of a corresponding switching means and the transmission of said switching actuation to a control beneath the glass ceramic plate according to FIGS. 1 to 3. It is possible by means of a mechanical switch corresponding to FIG. 4 to detune an electrical resonant circuit in the rotary toggle (i.e., to change the inductance or capacitance of a tuned circuit so its resonant frequency is different from the incoming signal frequency), for example from its resonant frequency to a different, or around another, frequency by the switching in or out of a certain amount of capacitance. This can be determined in a known manner from below the glass ceramic surface by a conventional interrogation or polling of the resonant circuit, for example as a modified damshaft of a lower, coupled resonant circuit, which can be evaluated as contacting and actuation of the contact sensor or switching means. In such a construction, it is also possible through different mechanical switches with different, switchable capacitances to carry out a differently detuning of a resonant circuit, which can be detected and differentiated as different actuations in corresponding manner from below the glass ceramic plate. This permits an even greater number of different actuations, particularly for the aforementioned functions of hotplate selection, hotplate power setting, multi-circuit connection and timer setting for a hotplate.

Figure 8:
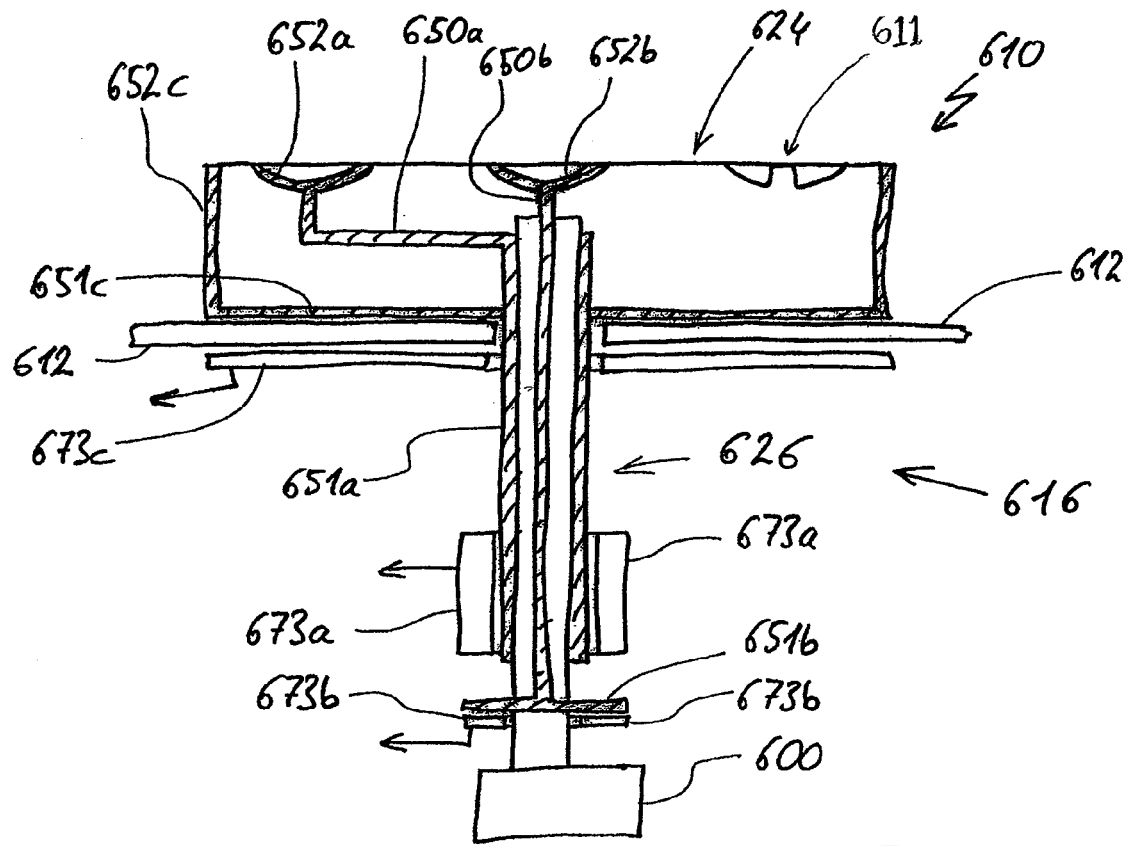
FIG. 8 A sixth embodiment as a further variant with a rotary control and fixed pivot shaft through a cover and capacitive detection of a contact.

FIG. 8 shows a further inventive operating device 610 with an operating unit 616 on a glass ceramic plate 612 or a panel. The rotary control 624 is constructed in the manner of a shallow knob, much as in FIG. 2. The rotary control 624 is fixed to a controller shaft or pivot shaft 626 terminating in a controller 600, as is described in DE 198 33 983 A1, for example. Pivot shaft 626 projects through a corresponding opening in glass ceramic plate 612. By rotating rotary control 624, the rotary movement is transmitted via pivot shaft 626 to controller 600, for example in much the same way as for other operating devices for power setting on an electrical appliance or hob.

As in the constructions according to FIG. 2, rotary control 624 has different metallic or flat, electrically conductive contact sensors 652. A first contact sensor 652a is provided in a depression to the left on the top of rotary control 624. It has an electrically conductive connection 650a with pivot shaft 626 and passes there into an electrically conductive envelope or metal tube 651a as a shaft, which is externally fitted to pivot shaft 626. It can also be an adequately stable, metallic tube, which forms the actual shaft and can be filled with insulating plastic, in which once again runs the electrically conductive connection 650b. Shortly prior to the transfer of pivot shaft 626 into controller 600 there is an electrically separated, annular or sleeve-like electrode 673a, which surrounds pivot shaft 626 and tube 651a. If a user contacts contact switch 652a by means of the previously described electrically conductive connection 650a and tube 651a, it is transferred along pivot shaft 626 behind glass ceramic plate 612, where the signal can be detected by electrode 673a for further processing purposes. Thus, sleeve 651a and electrode 673a are constructed circumferentially, so that transfer or transmission in any rotary position takes place in the manner described hereinbefore relative to FIG. 7. In the right-hand depression there is a small protuberance 611 serving as a tactile detection aid for operators who are sight-impaired.

A further contact sensor 652b is provided in the centre of the top of rotary control 624. Its electrically conductive connection 650b passes centrally through pivot shaft 626 to a lower, conductive surface 651b, which is fixed to pivot shaft 626. At a limited distance from the latter is provided a stationary ring electrode 673b through which passes pivot shaft 626. Much as described hereinbefore, the user's contact with contact switch 652b can be picked off or detected at electrode 673b for further use by a controller (not shown).

A type of third contact sensor 652c is formed in that on the circumferential side of rotary control 624 is provided a one-part, preferably completely circumferential electrical coating or electrically conductive surface. It is drawn flat downwards to the underside of rotary control 624 as electrode surface 651c. Beneath the glass ceramic plate 612 there is a large, annular ring electrode 673c in order to capacitively detect the contact of contact sensor 652c via electrode face 651c and this is transmitted to a control means. Electrode 651c and ring electrode 673c are both circumferential or as full surface as possible. In one embodiment contact sensor 652c and electrode face 651c form a type of beaker or pot, which completely or substantially completely in laterally outwardly and downwardly directed manner cover rotary control 624. In an extension of this construction, it is also possible to provide different, mutually separated contact sensors on the strip-like outer edge of rotary control 624. These contact sensors can then be guided to electrode faces which are provided with different radial spacing on the underside of rotary control 624. Much as in FIGS. 6 and 7, they form rotary paths, but with a different radius. It is then always possible to pick up the signal by means of ring electrodes with a different radius below glass ceramic plate 612.

The connection between rotary control 624 and pivot shaft 626 can be fixed and cannot be released, and this also applies to the electrical connections. However, it is also possible to insert pivot shaft 626 in rotary control 624 and the corresponding contact means are to be provided between the electrically conductive connection 650a, 650b and envelope 651a, as well as the portion of connection 650b within pivot shaft 626, i.e. the connection to face 651b. It is generally sufficient to have simple contact faces, because contact is not frequently released.

If only one of the two contact sensors 652a, 652b is provided, it is alternatively possible to make electrically conductive the entire pivot shaft 626, for example of metal and this then assumes responsibility for signal transmission and permits a simpler construction. It is also possible in place of the capacitive signal pickups through electrodes 673a, 673b to provide electric wipers and then they ultimately transmit the capacitive contact signal to one of the contact sensors.

Figure 9:
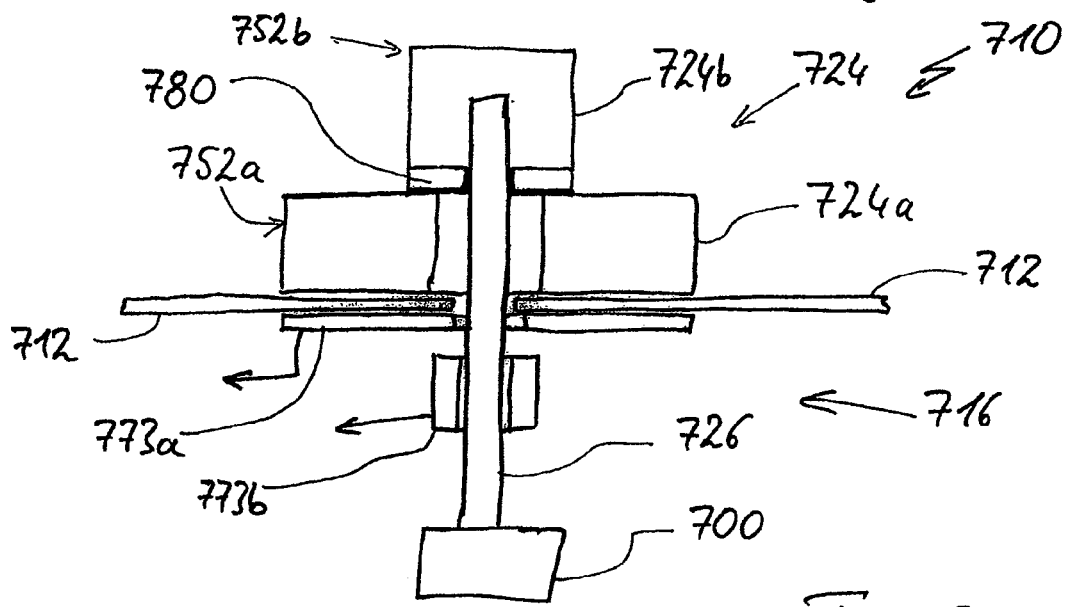
FIG. 9 A variant of an operating device according to FIG. 8 with a graduated rotary toggle.

FIG. 9 shows another embodiment of the operating device 710 with an operating unit 716. An important difference here is that a rotary control 724 comprises a shallower, wider lower part 724a and a much narrower upper part 724b placed thereon. Here both the lower part 724a and the upper part 724b are electrically conductive or are made from metal, but are insulated electrically against one another. Below a glass ceramic plate 712 there is a ring electrode 773a around pivot shaft 726 for picking up signals following contact of the metal lower part 724a. In place of a completely electrically conductive lower part 724a, it is also possible to adopt a construction according to FIG. 8 with electrically conductive faces.

Upper part 724b is connected by an insulation area 780, for example of plastic, to lower part 724a. A switching or pivot shaft 726 is made from metal and extends both through glass ceramic plate 712 with a corresponding hole and also through insulation 780 into upper part 724b. It is mechanically and electrically connected to upper part 724b, particularly since the latter is also made from metal. Outer electrode 773b is responsible for the signal pickup from pivot shaft 726. The lower end of pivot shaft 726 extends into controller 700, which can be constructed as described hereinbefore. Instead of being made from solid metal, upper part 724b can be constructed in accordance with FIG. 8 with electrically conductive faces as contact sensors and electrically conductive connections to a plastic body.

In the embodiment according to FIG. 9 the entire outside of lower part 724a forms a first contact sensor 752a. The entire upper part 724b forms a second contact sensor 752b. The connection of pivot shaft 726 to rotary control 724 or at least the upper part 724b can take place by clamshaft mounting. In the same way and similar to FIG. 8, the pivot shaft 726 can also be made from plastic with a downward metallic or electrically conductive insert.

The invention claimed is:

1. An operating device for an electrical appliance having an outer surface comprising: an operating unit and a control unit positioned below said outer surface, said operating unit comprising a rotary control and supported in a rotary manner on said outer surface, wherein on said rotary control is provided at least one switching means for generating a signal of a switching process of a user to said control unit.

2. The operating device according to claim 1, wherein said switching means is a pushbutton with electrical contacts.

3. The operating device according to claim 2, further comprising a first resonant circuit over said outer surface having a resonant frequency wherein activating said pushbutton modifies said resonant frequency allowing detection by said control unit of the operation of said pushbutton.

4. The operating device according to claim 1, wherein said switching means comprises a capacitively based contact switch or a contact sensor having a contact surface on said rotary control.

5. The operating device according to claim 1, wherein a magnetic armature is provided in said rotary control and, for indicating said rotary position of said rotary control, said operating device is connected in said operating unit to said magnetic armature, and underneath said outer surface a plurality of magnetic sensors are provided for detecting movement of said magnetic armature, wherein through the actuation of said switching means a distance between said magnetic armature and said outer surface changes.

6. The operating device according to claim 1, wherein said operating unit transmits signals of a switching process of said switching means changing an electric field below said outer surface.

7. The operating device according to claim 6, wherein said change to said electric field is initiated by a position change to a part of said operating unit.

8. The operating device according to claim 1, wherein said operating unit transmits said signal of said switching process of the switching means by changing an electric field strength below said outer surface, wherein said change is initiated by a human operator contacting said switching means.

9. The operating device according to claim 1, wherein said operating unit comprises a microprocessor transmitting said signal of said switching process of said switching means in a wireless manner to said electrical appliance.

10. The operating device according to claim 1, wherein said operating unit is held in position on said outer surface of said electrical appliance by one or more magnets.

11. The operating device according to claim 1, wherein said operating unit or rotary control is supported by means of a fixed, rotary shaft which runs through an opening in said outer surface and said shaft extends into a controller located below said outer surface.

12. The operating device according to claim 11, wherein an electric conductor is provided on said shaft in a longitudinal manner along said shaft, wherein signal transmission takes place by said electric conductor.

13. The operating device according to claim 11, wherein said switching means are provided in said rotary control and said shaft is connected to said switching means by a direct electrical connection.

14. The operating device according to claim 12, wherein a capacitor plate is attached to said rotary control and said electric conductor is connected to said capacitor plate, wherein said capacitor plate is capacitively coupled with a second capacitor plate provided in said operating device.

15. The operating device according to claim 12, wherein a first capacitor face is provided along an axial circumference of said shaft, said first capacitor face surrounded by a second capacitor face, wherein said electric conductor is connected in a central area of said first capacitor face.

16. The operating device according to claim 1, wherein said rotary control is constructed in multistage manner with different diameters, with a first diameter toggle portion as a lower part and a second diameter toggle portion as an upper part being located on said first diameter toggle portion, wherein each of said toggle portions has different switching means.

17. The operating device according to claim 1, wherein there is a capacitive detection of a rotary position of said rotary control.

18. The operating device according to claim 17, comprising at least one capacitive element of said rotary control and a plurality of corresponding capacitive elements beneath said outer surface for said capacitive detection of said rotary position of said rotary control.

19. The operating device according to claim 18, wherein said capacitive element of said rotary control is electrically connected to a contact sensor on said rotary control and wherein another capacitive element is electrically connected to another contact sensor on said rotary control.

20. The operating device according to claim 19, wherein a further capacitive element is located in a central area on said rotary control.

21. The operating device according to claim 1, wherein at least one capacitive element of said rotary control is connected to a contact sensor on said rotary control and is constructed in such a way that, independently of said rotary position, said capacitive element projects over at least one corresponding capacitive element beneath said outer surface.

22. The operating device according to claim 9, wherein power to the microprocessor is provided by contactless power transmission using an inductive power supply.

23. An electrical appliance for cooking with an operating device comprising an operating unit comprising a rotary control and being supported in a rotary manner on an outer surface of said electrical appliance, wherein on said rotary control is provided at least one switching means for generating a signal of a switching process of a user to said control unit wherein operating said switching means by moving said rotary control effects a switching function.

24. The electrical appliance according to claim 23, wherein at least in a first operating mode said switching means is activated and kept in said activated state, wherein at the same time said rotary control is activated or moved for an operation of said operating device.

25. The electrical appliance with an operating device according to claim 23, wherein activating said switching means effects a single switching function.

26. The electrical appliance according to claim 25, wherein said single switching function is configured to start operation of a functional unit of said electrical appliance when said rotary control is moved.

27. The electrical appliance according to claim 26, wherein said switching function determines a power level of said electrical appliance.

28. The electrical appliance according to claim 23, wherein by activating said switching means a present function of said operating device is chosen.

29. The electrical appliance according to claim 25, wherein by activating said switching means a present function of said operating device is chosen.

30. The electrical appliance according to claim 25, wherein by moving said rotary control into a specific position a first function is selected and, after either actuation by said switching means or changing said operating mode by a switching means, a second function of said electrical appliance is selected.

31. The electrical appliance according to claim 30, wherein said second function is a setting of a power level for said electrical appliance.

32. The electrical appliance according to claim 30, wherein said second function is a timer function.

33. A method of operating an electrical appliance comprising the step of:
   a user activating a switch, wherein the switch comprises an operating unit comprising a rotary control and being supported in a rotary manner on an outer surface of said electrical appliance, wherein on said rotary control is provided at least one switching means for generating a signal of a switching process of a user to said control unit wherein operating said switching means by moving said rotary control effects a switching function.

* * * * *

UNITED STATES PATENT AND TRADEMARK OFFICE
CERTIFICATE OF CORRECTION

PATENT NO. : 7,642,673 B2
APPLICATION NO. : 11/548036
DATED : January 5, 2010
INVENTOR(S) : Martin Baier Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 343 days.

Signed and Sealed this

Sixteenth Day of November, 2010

David J. Kappos
*Director of the United States Patent and Trademark Office*